(12) United States Patent
Krishnamurthi et al.

(10) Patent No.: US 6,538,899 B1
(45) Date of Patent: Mar. 25, 2003

(54) TRACELESS MIDPLANE

(75) Inventors: Ashok Krishnamurthi, San Jose, CA (US); Ramalingam K. Anand, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 09/751,838

(22) Filed: Jan. 2, 2001

(51) Int. Cl.$^7$ ............................................... H01R 12/16
(52) U.S. Cl. ..................... 361/788; 361/791; 361/792; 361/803; 439/61
(58) Field of Search .................. 361/788, 791, 361/792, 803–805, 825–829; 439/61, 65, 62; 710/126, 131, 101–103; 395/500

(56) References Cited

U.S. PATENT DOCUMENTS

| | | | | |
|---|---|---|---|---|
| 4,472,765 A | * | 9/1984 | Hughes ........................ | 361/729 |
| 4,838,798 A | * | 6/1989 | Evans et al. ................. | 439/493 |
| 5,296,748 A | * | 3/1994 | Wicklund et al. ........... | 326/101 |
| 5,429,521 A | | 7/1995 | Morlion et al. .............. | 439/108 |
| 5,887,158 A | | 3/1999 | Sample et al. ............... | 395/500 |
| 6,006,980 A | | 12/1999 | Lacourse et al. ............ | 228/180.21 |
| 6,163,464 A | * | 12/2000 | Ishibashi et al. ............ | 361/788 |
| 6,392,142 B1 | * | 5/2002 | Uzuka et al. ................ | 174/52.1 |

FOREIGN PATENT DOCUMENTS

EP               0494759 A1 * 8/1992

* cited by examiner

*Primary Examiner*—Albert W. Paladini
*Assistant Examiner*—Tuan Dinh
(74) *Attorney, Agent, or Firm*—Harrity & Snyder, L.L.P.

(57) ABSTRACT

A traceless midplane contains substantially no traces, pins, or active components and includes a front portion and a back portion. The front portion includes first connectors. The back portion includes second connectors arranged in a grid pattern. Each of the second connectors includes electrically-conductive conduits that connect the second connector to a corresponding one of the first connectors through the midplane. The second connectors include data connection points, ground connection points, and clock connection points. At least some of the data connection points are separated from each other and from the clock connection points by the ground connection points.

22 Claims, 6 Drawing Sheets

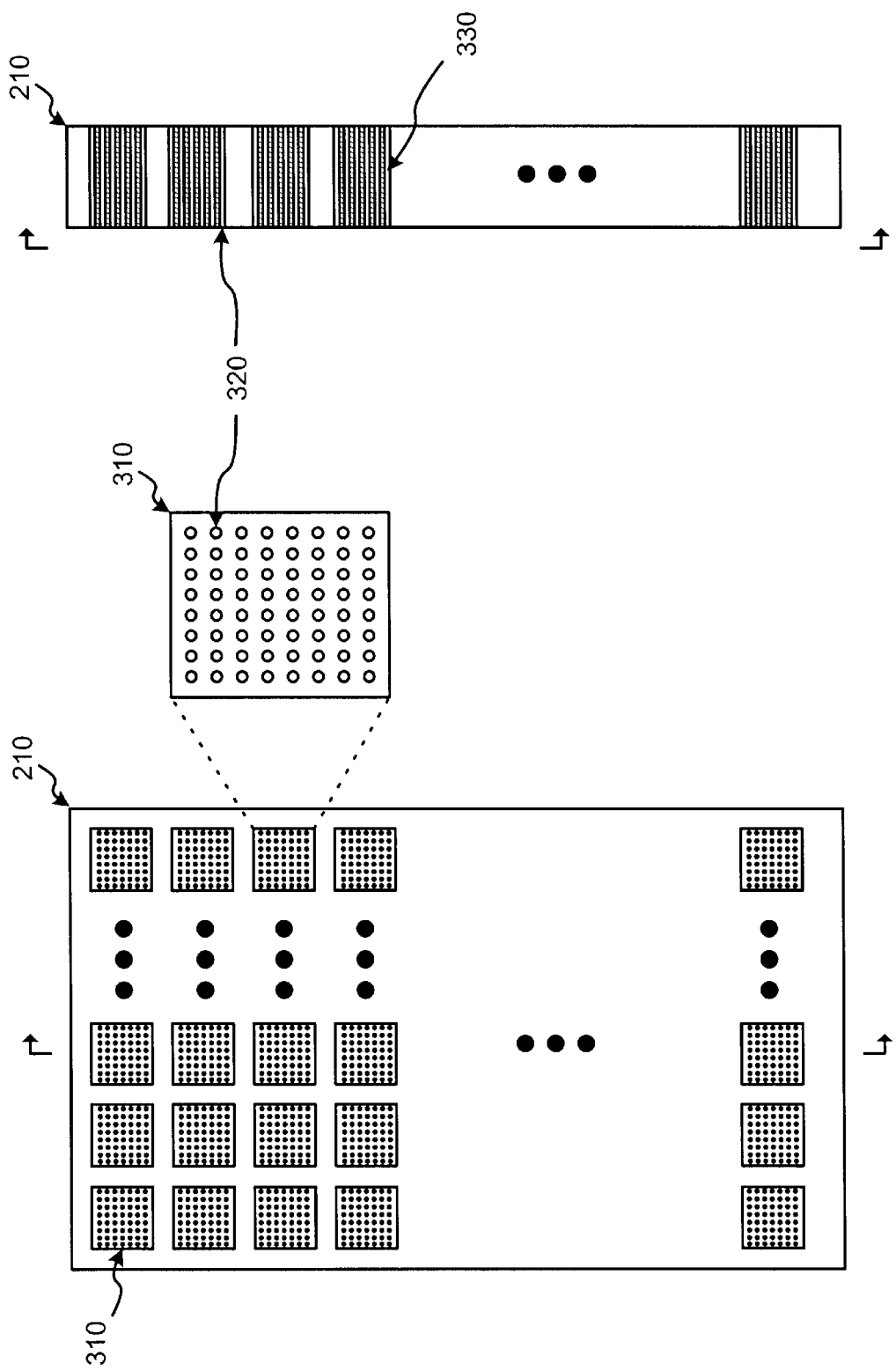

TRACELESS MIDPLANE

BACKGROUND OF THE INVENTION

A. Field of the Invention

The present invention relates generally to routing systems and, more particularly, to a traceless midplane that interconnects multiple boards of a network device.

B. Description of Related Art

Conventional network devices include multiple processing and/or switching boards that communicate with one another. Often, a backplane or midplane interconnects these boards so that they can communicate. These backplanes and midplanes, however, typically include traces (i.e., internal or external wires that interconnect connection points on the backplanes or midplanes), connection pins, and/or active circuitry to facilitate the communication between the boards. As the complexity of the network devices increases, the number of the traces in the backplanes and midplanes and the amount of pins and active circuitry required to manage the connections also increase, making it increasingly difficult to manufacture the backplanes and midplanes.

Also, a problem arises when an electrical fault occurs in the complex traces, pins, or active circuitry. The remedy usually takes the form of completely emptying the network device and replacing and/or troubleshooting the backplane or midplane.

Therefore, a need exists for an interconnecting mechanism that is easy to manufacture and permits communication between boards of a network device without suffering from electrical faults.

SUMMARY OF THE INVENTION

Systems and methods, consistent with the present invention, address this and other needs by providing a traceless midplane that facilitates the interconnection and communication of the boards of a network device. The traceless midplane contains no traces, pins, or active components, but only conduits that provide direct electrical connections between pins of the boards. Therefore, the midplane is easy to manufacture and less prone to electrical faults than midplanes that contain traces, pins, and/or active components.

In accordance with the purpose of the invention as embodied and broadly described herein, a traceless midplane, which contains substantially no traces, active components, or pins, includes a front portion and a back portion. The front portion includes first connectors. The back portion includes second connectors arranged in a grid pattern. Each of the second connectors includes electrically-conductive conduits that connect the second connector to a corresponding one of the first connectors through the midplane. The second connectors include data connection points, ground connection points, and clock connection points. At least some of the data connection points are separated from each other and from the clock connection points by the ground connection points.

In another implementation consistent with the present invention, a network device includes packet processor boards that include first pins, input/output control boards that include second pins, and a traceless midplane. The midplane interconnects the first pins of the packet processor boards and the second pins of the input/output control boards. The packet processor boards and the input/output control boards connect to the midplane in an orthogonal pattern. The midplane includes multiple connectors. Each of the connectors include multiple conductive conduits. Each of the conduits interconnects one of the first pins and one of the second pins through the midplane.

In a further implementation consistent with the present invention, a method for manufacturing a traceless midplane that contains no traces, active components, or pins, includes obtaining a printed circuit board; drilling holes to create conduits through the printed circuit board, where multiple conduits form one of the connectors; and placing electrically-conductive material in each of the conduits.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 3A and 3B are exemplary front and side cross section views of the midplane of FIGS. 2A–2C according to implementation consistent with the present invention.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

Systems and methods, consistent with the present invention, provide interconnectivity between boards of a network device via a midplane. The midplane contains no traces, pins, or active components, but instead contains conduits that provide direct electrical connections between pins of the interconnecting boards. Such a construction is easy to manufacture and minimizes electrical faults in the midplane and, therefore, minimizes the need to replace or troubleshoot the midplane.

EXEMPLARY NETWORK DEVICE CONFIGURATION

Figure 1:
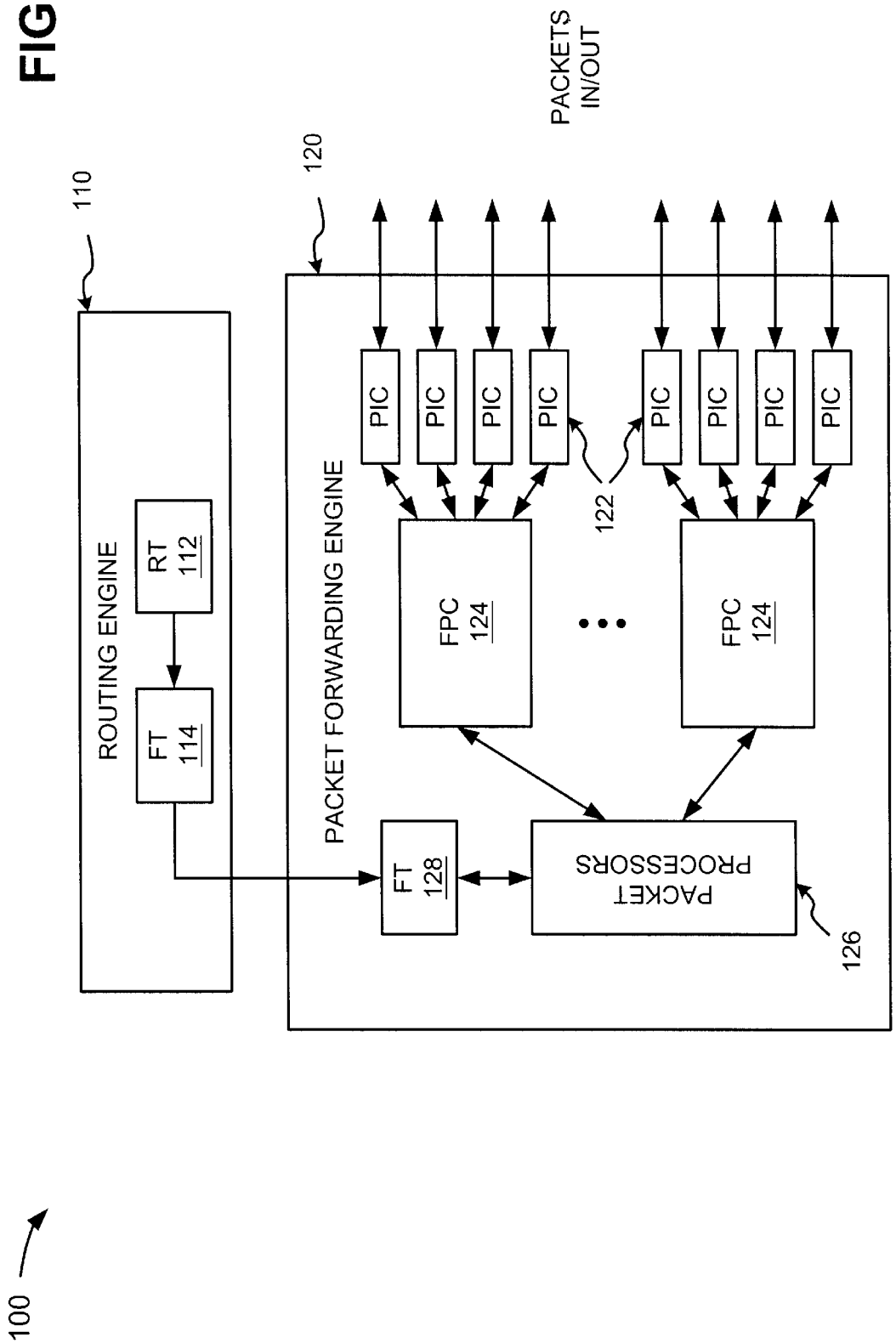
FIG. 1 is a diagram of an exemplary network device in which a passive midplane consistent with the present invention may be implemented.

FIG. 1 is a diagram of an exemplary network device in which systems and methods consistent with the present invention may be implemented. In this particular implementation, the network device takes the form of a router 100.

The router 100 may include a routing engine 110 and a packet forwarding engine 120. The routing engine 110 may perform routing updates and system management operations for the router 100. The routing engine 110 may include one or more routing tables 112 and a forwarding table 114. The routing table(s) 112 may consolidate routing information learned from routing protocols in the network. From the routing table(s) 112, the routing engine 110 determines the active routes to network destinations and records these routes in the forwarding table 114.

The packet forwarding engine 120 may make packet forwarding decisions for the router 100. The packet forwarding engine 120 may include programmable interface cards (PICs) 122, flexible PIC concentrators (FPCs) 124, one or more packet processors 126, and a forwarding table 128. The PICs 122 receive and transmit packets for the router 100. The PICs 122 may include media-specific logic that performs, for example, framing and checksum verification. Different types of PICs 122 may operate according to different transmission rates, such as OC-192 and OC-48 transmission rates, and protocols, such as the Synchronous Optical Networking (SONET), Asynchronous Transfer Mode (ATM), and Ethernet protocols.

The FPCs 124 may include input/output control logic that directs and manages the packets received and transmitted by the PICs 122. The FPCs 124 may, for example, count packets and bytes, apply class-of-service rules to packets, prioritize packets, and perform basic packet integrity checks. The packet processor(s) 126 may include logic that determines how to route the packets. The packet processor(s) 126 may operate upon packet header information received from the FPCs 124 to identify the PIC 122 to output the packet. The packet processor(s) may use the forwarding table 128 to make this determination. The forwarding table 128 may obtain a copy of the forwarding table 114 from the routing engine 110.

The routing engine 110 and packet forwarding engine 120 may be configured as a number of circuit boards in the router 100. For example, the packet forwarding engine 120 may include separate circuit boards for the packet processors 126 and the FPCs 124 interconnected by a midplane.

Figure 2A:
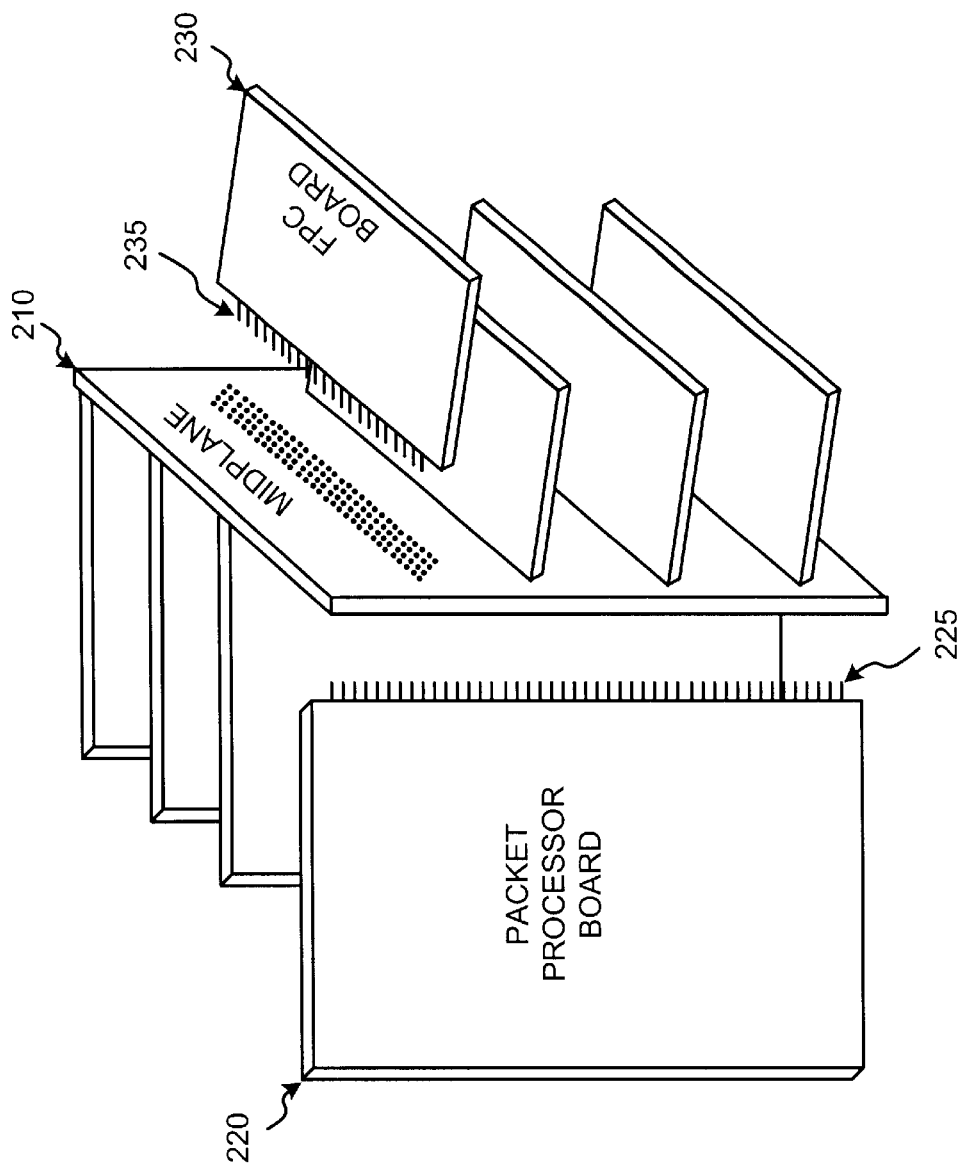
FIGS. 2A–2C are exemplary views of a midplane configuration consistent with the present invention.

FIG. 2A is an exemplary diagram of a midplane configuration consistent with the present invention. In this example, the midplane 210 interconnects circuit boards 220 which implement the packet processors 126 with circuit boards 230 which implement the FPCs 124. The midplane 210 may include a traceless circuit board that interconnects the packet processor boards 220 and the FPC boards 230 in an orthogonal (i.e., cross-hatch or cross-connect) pattern.

As shown in FIG. 2A, the packet processor boards 220 may connect to the midplane 210 in a vertical direction via pins 225 and the FPC boards 230 may connect to the midplane 210 in a horizontal direction via pins 235. The directions of the boards 220 and 230 may be reversed or different directions may be used in other implementations consistent with the present invention. With such a connection as shown in FIG. 2A, each of the packet processor boards 220 may be electrically connected with each of the FPC boards 230 through the midplane 210.

Figure 2C:
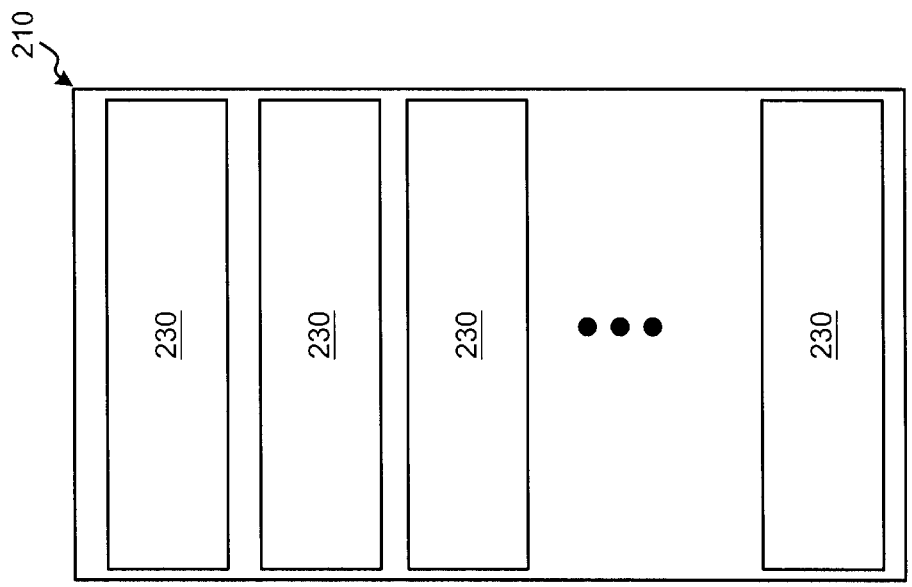
Figure 2B:
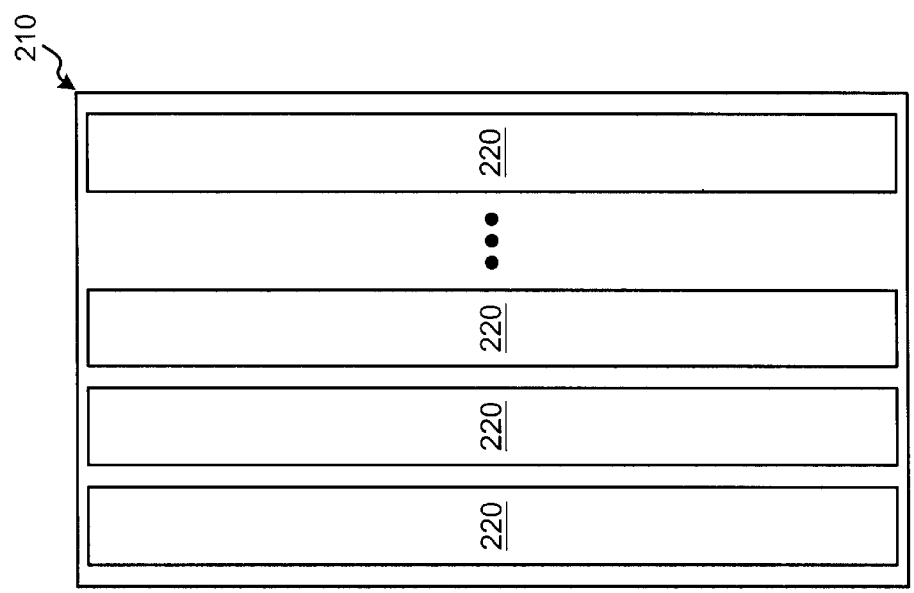

FIG. 2B is an exemplary diagram of a front view of the midplane 210. As shown, each of the packet processor boards 220 connect to the midplane 210 in a vertical direction. FIG. 2C is an exemplary diagram of a back view of the midplane 210. As shown, each of the FPC boards 230 connect to the midplane 210 in a horizontal direction.

FIGS. 3A and 3B are exemplary front and side cross section views of the midplane 210, respectively, according to an implementation consistent with the present invention. As shown in FIG. 3A, the midplane 210 may include multiple connectors 310 arranged in a grid pattern. The connectors 310 permit the packet processor boards 220 and the FPC boards 230 to communicate. Each of the connectors 310 may include multiple connection points 320.

As shown in FIG. 3B, each of the connection points 320 may include an electrically-conductive conduit 330, such as a copper tunnel, configured to connect a pin 225 of a packet processor board 220 and a pin 235 of a FPC board 230. The pins 225 of the packet processor boards 220 and the pins 235 of the FPC boards 230 need not physically touch each other. The conductive material (e.g., copper) in the conduit 330 completes the connection and acts as a direct connection to facilitate the transmission of signals between the pins. The midplane connections between the boards 220 and 230 are designed such that no traces, pins, or active components are needed to transmit signals between the pins 225 and 235 on the boards 220 and 230, respectively.

Figure 4:
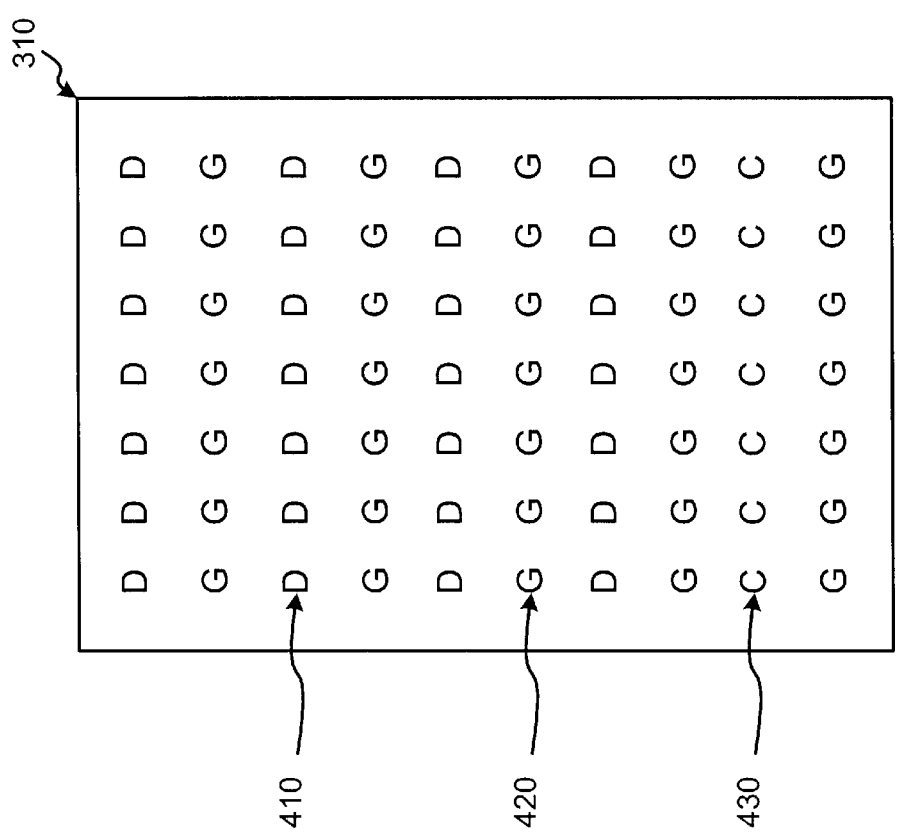
FIG. 4 is an exemplary diagram of a pin connection layout on the midplane of FIGS. 3A and 3B according to an implementation consistent with the present invention.

FIG. 4 is an exemplary diagram of a connector 310 according to an implementation consistent with the present invention. The connector 310 may include an AMP 2 mm hard metric connector with eight columns and ten rows of connection points 320. Different numbers of rows and columns may be used in other implementations consistent with the present invention.

The connector 310 may include different types of connection points 320, such as data (D) connection points 410, ground (G) connection points 420, and clock (C) connection points. The data connection points 410 convey data signals, such as high speed data signals, between boards. The ground connection points 420 provide ground connections between the boards. The clock connection points 430 convey clock signals between the boards. To minimize interference, the rows of data connection points 410 and clock connection points 420 may be separated from each other by rows of ground connection points 430.

METHOD OF MANUFACTURING MIDPLANE

Figure 5:
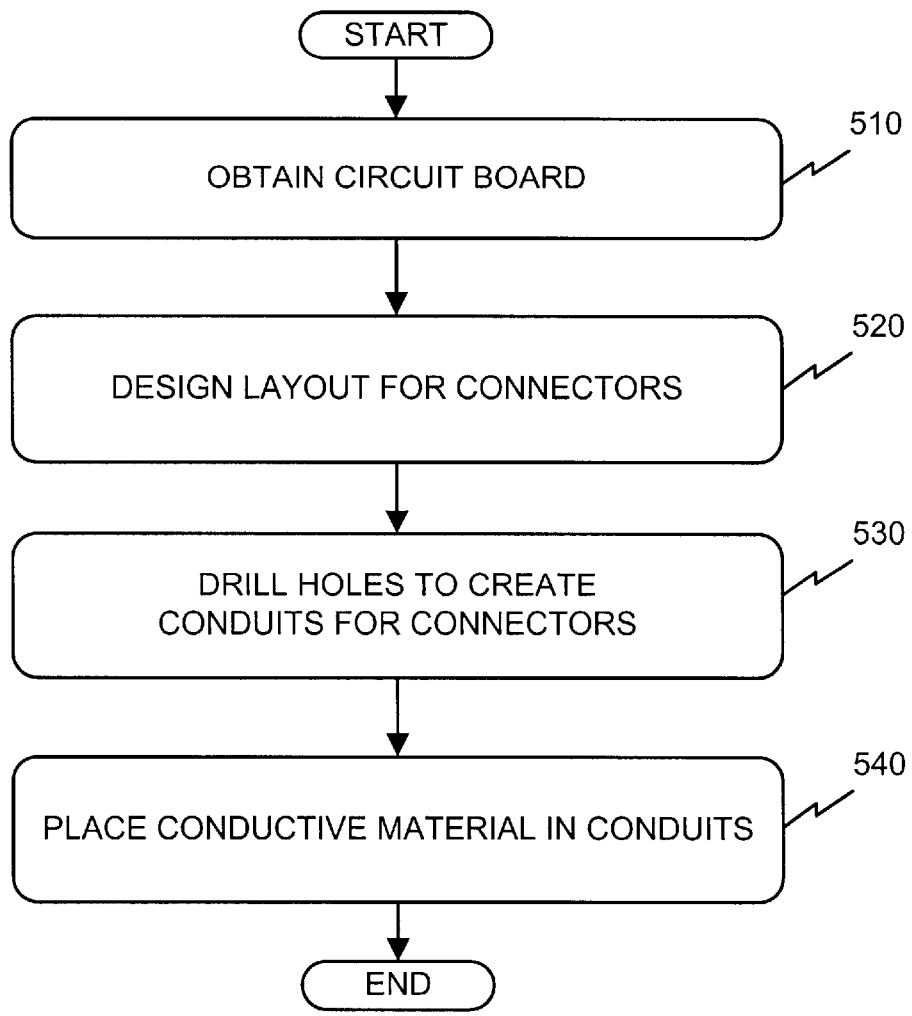
FIG. 5 is an exemplary flowchart of processing procedures for manufacturing a midplane in a manner consistent with the present invention.

FIG. 5 is an exemplary flowchart of processing for manufacturing a midplane in a manner consistent with the present invention. Processing may begin by obtaining a circuit board for the midplane [act 510]. The circuit board may be made of standard materials of a desired size. The layout of the connectors on the circuit board may then be designed [act 520]. The designing of the connectors may be an automated, manual, or partially automated process.

The conduits for the connectors may then be drilled in the circuit board [act 530]. Conventional drilling techniques may be used to create the conduits. Conductive material, such as copper, may then be placed in the conduits using conventional techniques [act 540].

While a series of acts have been described, the order of acts may differ in other implementations consistent with the present invention.

CONCLUSION

Systems and methods, consistent with the present invention, provide an interconnection mechanism that permits circuit boards to communicate. The interconnection mechanism may include a traceless midplane that contains no traces, pins, or active components. Instead, the interconnection mechanism uses only electrical conduits to provide direct connections between pins of the circuit boards. As a result, the interconnection mechanism is easy to manufacture. Also, the possibility of defects or faults associated with the interconnection mechanism is minimized.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. For example, while the midplane 210 has been described in the context of a network device, it may be used in other complex systems in other implementations consistent with the present invention.

Also, the midplane 210 has been described as containing no traces, pins, or active components. In other implementations consistent with the present invention, the midplane 210 contains substantially no, or very few, traces, pins, or active components.

The scope of the invention is defined by the claims and their equivalents.

What is claimed is:

1. A network device, comprising:
    a plurality of packet processor boards that include a plurality of first pins;
    a plurality of input/output control boards that include a plurality of second pins; and
    a midplane that includes substantially no traces, substantially no pins, and substantially no active components and is formed to interconnect the first pins of the packet processor boards and the second pins of the input/output control boards, the packet processor boards and the input/output control boards connecting to the midplane in an orthogonal pattern, the midplane including a plurality of connectors, each of the connectors including a plurality of conductive conduits, each of the conduits receiving and interconnecting one of the first pins and one of the second pins through the midplane.

2. The network device of claim 1, wherein each of the conduits includes an electrically-conductive material.

3. The network device of claim 1, wherein the packet processor boards and the input/output control boards connect to the midplane in vertical and horizontal planes.

4. The network device of claim 1, wherein the midplane includes no traces, pins, or active components.

5. The network device of claim 1, wherein each of the connectors includes:
    a plurality of data connection points,
    a plurality of ground connection points, and
    a plurality of clock connection points.

6. The network device of claim 1, wherein the network device is a router.

7. The network device of claim 2, wherein the electrically-conductive material is copper.

8. The network device of claim 5, wherein at least some of the data connection points are separated by at least some of the ground connection points.

9. The network device of claim 5, wherein the data connection points are separated from the clock connection points by the ground connection points.

10. A traceless midplane that contains substantially no traces, substantially no pins, and substantially no active components, comprising:
    a front portion including a plurality of first connectors; and
    a back portion including a plurality of second connectors arranged in a grid pattern, each of the second connectors including a plurality of electrically-conductive conduits that connect the second connector to a corresponding one of the first connectors through the midplane, the second connectors including a plurality of data connection points, a plurality of ground connection points, and a plurality of clock connection points, at least some of the data connection points being separated by at least some of the ground connection points and the data connection points being separated from the clock connection points by the ground connection points.

11. The traceless midplane of claim 10, wherein each of the conduits includes an electrically-conductive material.

12. The traceless midplane of claim 10, wherein the first connectors are configured to connect to a plurality of first printed circuit boards in a first direction, and the second connectors are configured to connect to a plurality of second printed circuit boards in a second direction, the second direction being orthogonal to the first direction.

13. The traceless midplane of claim 11, wherein the electrically-conductive material is copper.

14. The traceless midplane of claim 12, wherein the first printed circuit boards include packet processor boards and the second printed circuit boards include input/output control boards of a network router.

15. The traceless midplane of claim 12, wherein the first direction is in a vertical plane and the second direction is in a horizontal plane.

16. A method for manufacturing a traceless midplane that contains no traces, no pins, and no active components, comprising:
    obtaining a printed circuit board that includes first and second sides;
    providing holes to create conduits through the printed circuit board, the conduits being formed to receive pins of a plurality of first circuit boards at the first side and pins of a plurality of second circuit boards at the second side, the first circuit boards and the second circuit boards connecting to the printed circuit board in an orthogonal pattern; and
    placing electrically-conductive material in each of the conduits.

17. The method of claim 16, wherein the first circuit boards include packet processor boards and the second circuit boards include input/output control boards of a network router.

18. The method of claim 16, wherein the conduits are formed in a grid pattern, the conduits being configured to connect to the first circuit boards in a vertical direction on the first side and connect to the second circuit boards in a horizontal direction on the second side.

19. The method of claim 16, wherein the electrically-conductive material includes copper.

20. The method of claim 16, further comprising:
    designing a layout of connectors for the printed circuit board, each of the connectors including a plurality of the conduits.

21. A network device, comprising:
    a plurality of first boards that include a plurality of first pins;
    a plurality of second boards that include a plurality of second pins; and
    a midplane that includes substantially no traces, substantially no pins, and substantially no active components and is formed to interconnect the first pins of the first boards and the second pins of the second boards, the first boards and the second boards connecting to the midplane in an orthogonal pattern, the midplane including a plurality of connectors, each of the connectors including a plurality of conductive conduits, each of the conduits receiving and interconnecting one of the first pins and one of the second pins through the midplane.

22. A midplane that contains no traces, substantially no pins, and substantially no active components, comprising:
    a front portion including a plurality of first connectors; and a back portion including a plurality of second connectors arranged in a grid pattern, each of the second connectors including a plurality of electrically-conductive conduits that connect the second connector to a corresponding one of the first connectors through the midplane, the second connectors including a plurality of data connection points, a plurality of ground connection points, and a plurality of clock connection points, at least some of the data connection points being separated from each other by at least some of the ground connection points and the data connection points being separated from the clock connection points by the ground connection points.

\* \* \* \* \*